(12) United States Patent
Goodwin

(10) Patent No.: US 7,474,973 B2
(45) Date of Patent: Jan. 6, 2009

(54) APPARATUS AND METHOD FOR DETECTING AND ANALYZING SPECTRAL COMPONENTS IN PREDETERMINED FREQUENCY BANDS WITHIN A SIGNAL, FREQUENCY FILTER, AND RELATED COMPUTER-READABLE MEDIA

(75) Inventor: Paul A. Goodwin, Anchorage, AK (US)

(73) Assignee: Variance Dynamicaz, Inc., Anchorage, AK (US)

( * ) Notice: Subject to any disclaimer, the term of this patent is extended or adjusted under 35 U.S.C. 154(b) by 144 days.

(21) Appl. No.: 10/875,189

(22) Filed: Jun. 25, 2004

(65) Prior Publication Data

US 2005/0086015 A1  Apr. 21, 2005

Related U.S. Application Data

(60) Provisional application No. 60/482,512, filed on Jun. 25, 2003.

(51) Int. Cl.
*G01R 23/00* (2006.01)
*G01R 23/16* (2006.01)

(52) U.S. Cl. ................... 702/76; 702/75; 702/189; 324/76.19

(58) Field of Classification Search ............. 702/75–77, 702/66, 70, 73, 74, 124, 126, 189, 190; 324/76.19, 324/76.21, 76.22, 76.39, 76.41; 327/39, 327/41, 44, 473, 474; 708/819–821, 311, 708/312

See application file for complete search history.

(56) References Cited

U.S. PATENT DOCUMENTS

| | | | | |
|---|---|---|---|---|
| 3,244,937 A | * | 4/1966 | Blackburn | .................... 361/51 |
| 3,364,429 A | * | 1/1968 | Jensen | ....................... 329/348 |
| 3,419,787 A | * | 12/1968 | Baehre | ....................... 363/127 |
| 3,434,075 A | * | 3/1969 | Hawkins | ...................... 332/146 |
| 3,512,013 A | * | 5/1970 | Calfee | ......................... 327/102 |
| 3,609,563 A | * | 9/1971 | Zinn et al. | ..................... 327/47 |
| 3,611,129 A | * | 10/1971 | Simurda | ................... 324/76.68 |
| 3,839,649 A | * | 10/1974 | Morio | .......................... 327/42 |

(Continued)

FOREIGN PATENT DOCUMENTS

WO  WO 00/29970  * 5/2000

OTHER PUBLICATIONS

"New Riverside University Dictionary", 1988, The Riverside Publishing Company, p. 1249.*

*Primary Examiner*—Hal D Wachsman
(74) *Attorney, Agent, or Firm*—Michael J. Tavella

(57) ABSTRACT

An apparatus for detecting spectral components in a predetermined frequency band within a signal includes first and second processing devices and first, second, and third connectors tuned to the frequency band. The first processing device includes first, second, and third elements. The second processing device includes fourth, fifth, and sixth elements. The first connector is coupled to the first and fourth elements, the second connector to the second and fifth elements, and the third connector to the third and sixth elements. An apparatus for analyzing spectral components in predetermined frequency bands within a signal includes an input for receiving the signal, a device for isolating a portion of the signal, and frequency detectors coupled in parallel to the device. Each frequency detector corresponds to a frequency band and generates an output signal component corresponding to a proportion of energy of the spectral components detected by the frequency detector.

38 Claims, 17 Drawing Sheets

U.S. PATENT DOCUMENTS

| | | | |
|---|---|---|---|
| 5,155,802 A * | 10/1992 | Mueller et al. | 706/39 |
| 6,037,806 A * | 3/2000 | Smith et al. | 327/47 |
| 6,654,729 B1 * | 11/2003 | Hickman et al. | 706/15 |
| 6,915,121 B2 * | 7/2005 | Python et al. | 455/266 |
| 7,139,540 B2 * | 11/2006 | Wu et al. | 455/251.1 |
| 7,187,229 B2 * | 3/2007 | Pelly | 327/551 |

* cited by examiner

| ENL Orbit Radius (nm) | Length of One Leg, Thus Implying Wavelength (nm) | Implied Linear Frequency (Hz) in Copper [$c = 1.5 \times 10^8$ m/s] | Implied Linear Frequency (Hz) in Low-Speed Medium [$c = 5 \times 10^7$ m/s] |
|---|---|---|---|
| 10 | $3 \times 10^1$ | $5 \times 10^{15}$ | $2 \times 10^{15}$ |
| 50 | $2 \times 10^2$ | $1 \times 10^{15}$ | $3 \times 10^{14}$ |
| 100 | $3 \times 10^2$ | $5 \times 10^{14}$ | $2 \times 10^{14}$ |
| 200 | $6 \times 10^2$ | $2 \times 10^{14}$ | $8 \times 10^{13}$ |
| 500 | $2 \times 10^3$ | $1 \times 10^{14}$ | $3 \times 10^{13}$ |
| 1,000 | $3 \times 10^3$ | $5 \times 10^{13}$ | $2 \times 10^{13}$ |
| 10,000 | $3 \times 10^4$ | $5 \times 10^{12}$ | $2 \times 10^{12}$ |

Fig. 9

| ENL Orbit Radius (m) | Length of One Leg, Thus Implying Wavelength (m) | Implied Linear Frequency (Hz) in Copper [$c = 1.5 \times 10^8$ m/s] | Implied Linear Frequency (Hz) in Low-Speed Medium [$c = 5 \times 10^7$ m/s] |
|---|---|---|---|
| $1 \times 10^{-6}$ | $3 \times 10^{-6}$ | $5 \times 10^{13}$ | $2 \times 10^{13}$ |
| $1 \times 10^{-5}$ | $3 \times 10^{-5}$ | $5 \times 10^{12}$ | $2 \times 10^{12}$ |
| $1 \times 10^{-4}$ | $3 \times 10^{-4}$ | $5 \times 10^{11}$ | $2 \times 10^{11}$ |
| $1 \times 10^{-3}$ | $3 \times 10^{-3}$ | $5 \times 10^{10}$ | $2 \times 10^{10}$ |
| $1 \times 10^{-2}$ | $3 \times 10^{-2}$ | $5 \times 10^{9}$ | $2 \times 10^{9}$ |
| $1 \times 10^{-1}$ | $3 \times 10^{-1}$ | $5 \times 10^{8}$ | $2 \times 10^{8}$ |

Fig. 10

| ENL Inside Orbit Radius (nm) | $\lambda_a$ (nm) | Additive Term (nm) [equal to $\pi$ times the 10 nm feature size] | $\lambda_b$ (nm) |
|---|---|---|---|
| 100 | 314.159 | 31.416 | 345.575 |
| 200 | 628.319 | 31.416 | 659.734 |
| 500 | 1,570.796 | 31.416 | 1,602.212 |
| 1,000 | 3,141.593 | 31.416 | 3,173.009 |
| 10,000 | 31,415.927 | 31.416 | 31,447.342 |

Fig. 11

| ENL Inside Orbit Radius (nm) | $\lambda_a$ (nm) | Additive Term (nm) [equal to $\pi$ times the 50 nm feature size] | $\lambda_b$ (nm) |
|---|---|---|---|
| 100 | 314.159 | 157.080 | 471.239 |
| 200 | 628.319 | 157.080 | 785.398 |
| 500 | 1,570.796 | 157.080 | 1,727.876 |
| 1,000 | 3,141.593 | 157.080 | 3,298.672 |
| 10,000 | 31,415.927 | 157.080 | 31,573.006 |

Fig. 12

| ENL Inside Orbit Radius (nm) | $\lambda_a$ (nm) | Additive Term (nm) [equal to $\pi$ times the 100 nm feature size] | $\lambda_b$ (nm) |
|---|---|---|---|
| 100 | 314.159 | 314.159 | 628.319 |
| 200 | 628.319 | 314.159 | 942.478 |
| 500 | 1,570.796 | 314.159 | 1,884.956 |
| 1,000 | 3,141.593 | 314.159 | 3,455.752 |
| 10,000 | 31,415.927 | 314.159 | 31,730.086 |

Fig. 13

| ENL Inside Orbit Radius (nm) | $f_a$ (Hz) in Copper [c = 1.5 x 10$^8$ m/s] | $f_b$ (Hz) in Copper [c = 1.5 x 10$^8$ m/s] [10 nm feature size] | Frequency Bandwidth (Hz) [10 nm feature size] |
|---|---|---|---|
| 100 | 4.775 x 10$^{14}$ | 4.341 x 10$^{14}$ | 4.341 x 10$^{13}$ |
| 200 | 2.387 x 10$^{14}$ | 2.274 x 10$^{14}$ | 1.137 x 10$^{13}$ |
| 500 | 9.549 x 10$^{13}$ | 9.362 x 10$^{13}$ | 1.872 x 10$^{12}$ |
| 1,000 | 4.775 x 10$^{13}$ | 4.727 x 10$^{13}$ | 4.727 x 10$^{11}$ |
| 10,000 | 4.775 x 10$^{12}$ | 4.770 x 10$^{12}$ | 4.770 x 10$^9$ |

Fig. 14

| ENL Inside Orbit Radius (nm) | $f_a$ (Hz) in Copper [c = 1.5 x 10$^8$ m/s] | $f_b$ (Hz) in Copper [c = 1.5 x 10$^8$ m/s] [50 nm feature size] | Frequency Bandwidth (Hz) [50 nm feature size] |
|---|---|---|---|
| 100 | 4.775 x 10$^{14}$ | 3.183 x 10$^{14}$ | 1.592 x 10$^{14}$ |
| 200 | 2.387 x 10$^{14}$ | 1.910 x 10$^{14}$ | 4.775 x 10$^{13}$ |
| 500 | 9.549 x 10$^{13}$ | 8.681 x 10$^{13}$ | 8.681 x 10$^{12}$ |
| 1,000 | 4.775 x 10$^{13}$ | 4.547 x 10$^{13}$ | 2.274 x 10$^{12}$ |
| 10,000 | 4.775 x 10$^{12}$ | 4.751 x 10$^{12}$ | 2.375 x 10$^{10}$ |

Fig. 15

| ENL Inside Orbit Radius (nm) | $f_a$ (Hz) in Copper [c = 1.5 x 10$^8$ m/s] | $f_b$ (Hz) in Copper [c = 1.5 x 10$^8$ m/s] [100 nm feature size] | Frequency Bandwidth (Hz) [100 nm feature size] |
|---|---|---|---|
| 100 | 4.775 x 10$^{14}$ | 2.387 x 10$^{14}$ | 2.387 x 10$^{14}$ |
| 200 | 2.387 x 10$^{14}$ | 1.592 x 10$^{14}$ | 7.958 x 10$^{13}$ |
| 500 | 9.549 x 10$^{13}$ | 7.958 x 10$^{13}$ | 1.592 x 10$^{13}$ |
| 1,000 | 4.775 x 10$^{13}$ | 4.341 x 10$^{13}$ | 4.341 x 10$^{12}$ |
| 10,000 | 4.775 x 10$^{12}$ | 4.727 x 10$^{12}$ | 4.727 x 10$^{10}$ |

APPARATUS AND METHOD FOR DETECTING AND ANALYZING SPECTRAL COMPONENTS IN PREDETERMINED FREQUENCY BANDS WITHIN A SIGNAL, FREQUENCY FILTER, AND RELATED COMPUTER-READABLE MEDIA

CROSS REFERENCE TO RELATED APPLICATIONS

This application claims the benefit under 35 U.S.C. § 119 (e) based on provisional application No. 60/482,512, filed Jun. 25, 2003, in the U.S. Patent and Trademark Office, the content of which is relied upon and incorporated herein by reference.

BACKGROUND OF THE INVENTION

1. Field of the Invention

The present invention relates to automatic Fourier analyzer circuits and also to automatic Fourier analyzer circuits using electronic neural loops to conduct waveform analyses.

2. Description of the Related Art

Signal waveform analysis has been performed mathematically through the technique of Fourier analysis. In this type of analysis, a signal waveform is represented as a mathematical function. The function is then manipulated to produce a series of amplitudes at various frequencies. The amplitudes and frequency patterns are representative of the signal waveform. Although Fourier analysis has been used for many years, it is often a difficult analysis to perform. Computers can help, but a computer often cannot perform the initial representation of the waveform as a function. Moreover, although many basic types of waveforms have been analyzed, waveforms that are more complex often have to be analyzed by breaking them down into simpler parts.

SUMMARY OF THE INVENTION

An Electronic Neural Loop ("ENL") is a tuned circuit designed to produce an output voltage only when a signal containing the frequency to which that ENL is tuned appears.

An ENL typically comprises first and second processing devices and first, second, and third connectors. The first processing device comprises first, second, and third elements. The second processing device comprises fourth, fifth, and sixth elements. The first connector is coupled to the first and fourth elements, the second connector is coupled to the second and fifth elements, and the third connector is coupled to the third and sixth elements. Each connector is tuned to a predetermined frequency band.

The first and/or second processing devices may comprise, for example, electrochemical or semiconductor devices. At least one of the connectors may comprise, for example, an ohmic connection, a waveguide, an integrated circuit conducting connection, or an integrated circuit semiconducting connection. At least one of the semiconductor devices may comprise, for example, a transistor, a field effect transistor, a complementary metal-oxide semiconductor, a bipolar junction transistor, an NPN transistor, or a PNP transistor. The first, second, and third elements may, for example, be a base, collector, and emitter of a transistor.

An ENL may be used, for example, to detect one or more spectral components in a predetermined frequency band within a signal.

An Automatic Fourier Analyzer ("AFA") is a circuit designed to produce current or voltage amplitudes for a number of frequencies that are found in an input signal waveform. Thus, an AFA receives an input signal and automatically produces an output that is a true Fourier analysis of the signal. This output is initially in analog form and can be viewed as a set of amplitudes and frequencies, or it can be digitized and considered as a digital word (or code) that describes the given signal. If digitized, the codes are then usable with digital databases.

An AFA can comprise a number of ENLs connected in parallel so that as a complicated signal is fed into the AFA, every ENL that finds its tuned frequency as a component of the input signal produces an output current and/or voltage. This output current and/or voltage is proportional to the current and/or voltage level for a given frequency, as developed in any Fourier analysis. By having a number of ENLs tuned to different frequencies, complicated signals can be analyzed quickly and automatically. An AFA can be made as accurate and reliable as desired by including in its design enough ENLs to cover the entire input frequency range, effectively with almost any desired bandwidth for a given ENL.

Because of its automatic operational feature, an AFA needs no programming to generate unique, serialized data codes—like the combination of a combination lock—that can be used as an address for databases. This is contrasted with the Fourier analyses currently used, which rely on very large, complex—and expensive—pattern recognition algorithms with concomitant software. The AFA thus performs a given function, in this case a Fourier transform, of a data field much less expensively, much faster, and much more reliably than the current approaches allow.

An AFA typically comprises an input for receiving the input signal, a device coupled to the input for isolating a portion of the input signal extending over a discrete time period, and a plurality of frequency detectors each coupled in parallel to the device. Each frequency detector corresponds to one of the frequency bands and typically comprises first and second processing devices and first, second, and third connectors. The first processing device comprises first, second, and third elements. The second processing device comprises fourth, fifth, and sixth elements. The first connector is coupled to the first and fourth elements, the second connector is coupled to the second and fifth elements, and the third connector is coupled to the third and sixth elements. Each connector is tuned to a respective frequency band and generates an output signal component corresponding to a proportion of energy of the spectral component or components detected by the frequency detector to the total energy of the input signal portion. The first and/or second processing devices may comprise, for example, electrochemical or semiconductor devices.

An AFA may be used, for example, to analyze detected spectral components in predetermined frequency bands within an input signal.

As noted above, an AFA may comprise a number of ENLs connected in parallel. Those ENLs may comprise a transistor pair, where the transistors are connected by "wires" that are specifically sized to act as active components in the ENL, tuning the ENL. This allows the ENL to operate only on a narrow band of frequencies. When the AFA receives an input signal, the ENLs that encounter frequency components matching their tuning are "turned on" and produce an output current and/or voltage. This happens automatically and virtually instantaneously. Once all of ENLs that see frequency components have been "turned on," the output is a set of currents and/or voltages for a specific set of frequencies. The AFA's analog output can be plotted to produce a Fourier series expansion instantly. In addition or in the alternative, the

BRIEF DESCRIPTION OF THE DRAWINGS

FIG. 9 is a table comparing orbit radius in nanometers, implied wavelength, and implied frequency;

FIG. 10 is a table comparing orbit radius in meters, implied wavelength, and implied frequency;

FIG. 11 is a table comparing orbit radius in nanometers, inside wavelength, and outside wavelength at a 10 nm feature size;

FIG. 12 is a table comparing orbit radius in nanometers, inside wavelength, and outside wavelength at a 50 nm feature size;

FIG. 13 is a table comparing orbit radius in nanometers, inside wavelength, and outside wavelength at a 100 nm feature size;

FIG. 14 is a table comparing orbit radius in nanometers, inside frequency, outside frequency, and frequency bandwidth at a 10 nm feature size;

FIG. 15 is a table comparing orbit radius in nanometers, inside frequency, outside frequency, and frequency bandwidth at a 50 nm feature size;

FIG. 16 is a table comparing orbit radius in nanometers, inside frequency, outside frequency, and frequency bandwidth at a 100 nm feature size;

DETAILED DESCRIPTION OF THE EXEMPLARY EMBODIMENTS

Figure 1:
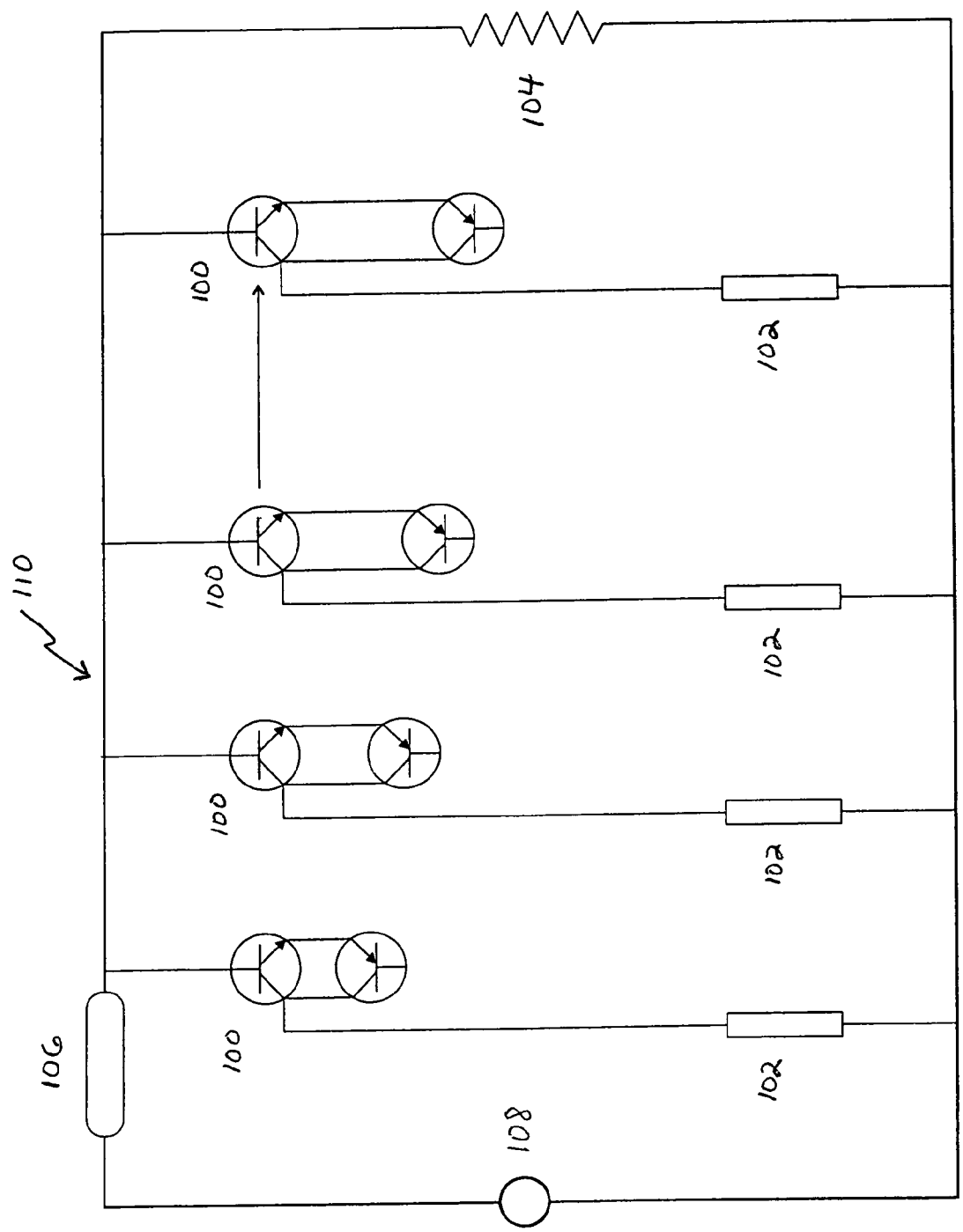
FIG. 1 is a representational view of an exemplary embodiment of an Automatic Fourier Analyzer.

FIG. 1 is a representational view of an exemplary embodiment of an Automatic Fourier Analyzer. In this exemplary embodiment, a number of ENLs 100 are shown in parallel. Each ENL comprises a transistor pair, as discussed below.

An output node 102 is provided for each ENL. Each output node produces a voltage at a specific frequency. Thus, as noted on the FIG. 1, the first ENL produces an output voltage at frequency f1; the second ENL produces an output voltage at frequency f2; and so on. The specifics of the frequencies and voltages are discussed below. The other elements that make up the AFA circuit are end load 104, blinker 106, and an input signal 108. The input signal can come from any source; for example, a charge-coupled device ("CCD"), a microphone, or some other broadband or narrowband signal source.

The frequency tuning of ENLs is "size" dependent in that physical and electrical properties, for example, of the connectors (such as wires) affect the frequency response of the ENLs. For example, the connectors coupling a pair of transistors in an ENL may be of a specific physical length corresponding to the frequency band of interest. In addition or in the alternative, for example, the connectors may be of different electrical length corresponding to the frequency band of interest.

When an electromagnetic signal travels along input bus 110, it encounters ENLs 100 serially, i.e., one at a time. Thus, data, even if it is in the form of a continuous pulse, activates the ENLs one by one. Because the ENLs are each a different "size," each ENL accepts and therefore draws energy from only that part of the signal that "fits" on it. Thus, only a certain frequency, which may or may not be present within the makeup of the input signal, is diverted along the pathway connected to the particular ENL. The signal is therefore quantized according to frequency (and, hence, according to wavelength). The first ENL encountered extracts a certain amount of energy at a particular frequency from the original signal. The signal moves on encountering the second ENL. The second ENL then draws its activation energy from the signal, only at a different frequency than the first. When the signal gets to the end of the line, each ENL has drawn a certain amount of energy from the signal, but not all the energy. There is some residual energy left and end load 104 is used to bleed off the residual energy (and to prevent the back-propagation of reflected waves that may occur by simply terminating the input bus). End load 104 may comprise, for example, a resistor or a resistor in parallel with a capacitor. The value of the resistor and capacitor depends on the input and the total energy drain of the cumulative ENLs. The capacitor in parallel with the resistor stabilizes transistor operation.

The blinker 106 is another component of the circuit. The role of the blinker is to frame the input data in data transmission packets. In this way, the AFA reads the framed input to produce a discreet Fourier code for that frame. In this way, the AFA can handle complex waves without becoming overloaded. This is also discussed in more detail below.

An AFA can be thought of as a form of "T" filter. It should be clear from the structure of an AFA that for a given signal input, the output of the AFA—a series of current and/or voltage amplitudes at different frequencies—is a form of a Fourier series expansion of the input function. This is because the AFA can automatically deliver as many Fourier series components as there are ENLs, whereas to duplicate this performance by calculation would require more and more separate calculations. The details of this output and comparisons to actual Fourier series expansions are discussed below. However, it is clear that, depending on the number of ENLs used, the output of the AFA can be as good or better than a Fourier analysis done by calculation.

Figure 2:
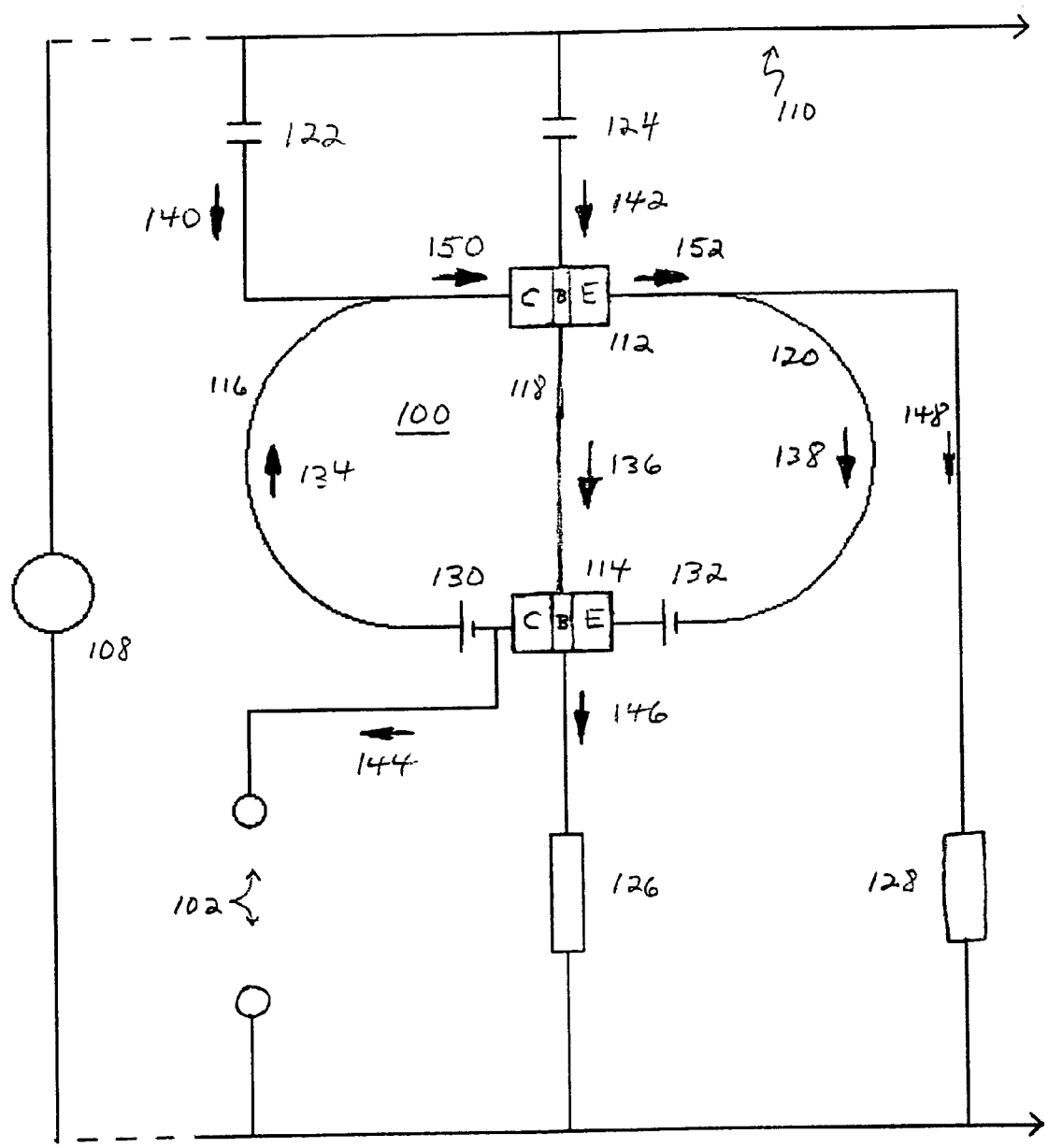
FIG. 2 is a schematic diagram of a first exemplary embodiment of an ENL.

One element of the AFA circuit is the ENL. FIG. 2 is a schematic diagram of a first exemplary embodiment of an ENL. In this exemplary embodiment, ENL 100 comprises NPN transistor 112 and PNP transistor 114. Connector 116 is coupled to the collectors of NPN transistor 112 and PNP transistor 114, connector 118 is coupled to the bases of NPN transistor 112 and PNP transistor 114, and connector 120 is coupled to the emitters of NPN transistor 112 and PNP transistor 114. ENL 100 further comprises output nodes 102 and elements 122, 124, 126, 128, 130, and 132. FIG. 2 also shows exemplary directions of current flow 134, 136, 138, 140, 142, 144, 146, 148, 150, and 152.

Figure 3:
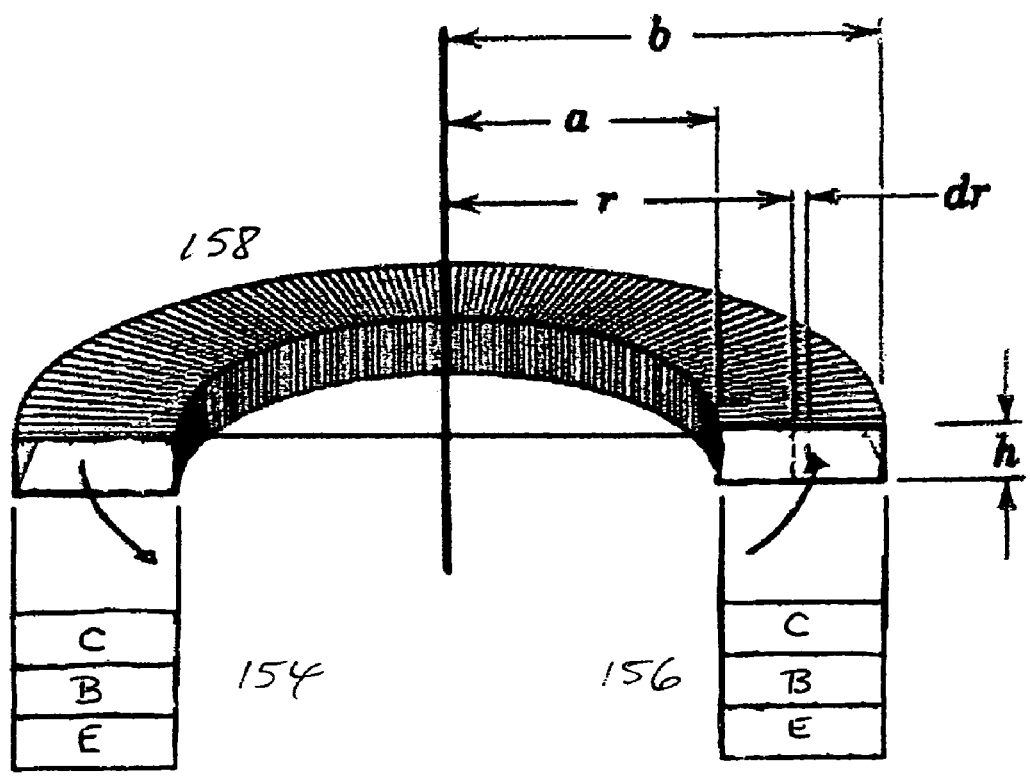
FIG. 3 is a front perspective view of a second exemplary embodiment of an ENL, showing a first connector coupled to the collectors of two transistors.
Figure 4:
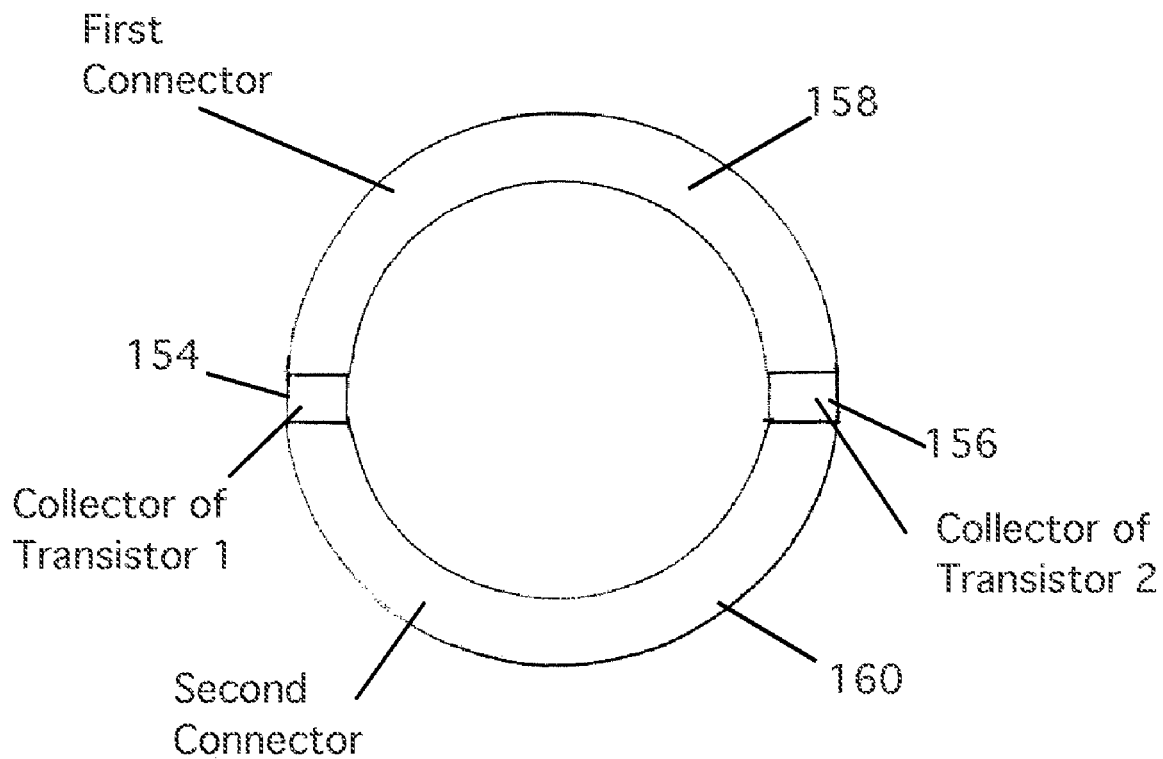
FIG. 4 is a top view of the second exemplary embodiment of an ENL, showing the first connector coupled to the collectors of the two transistors and a second connector coupled to the emitters of the two transistors.
Figure 5:
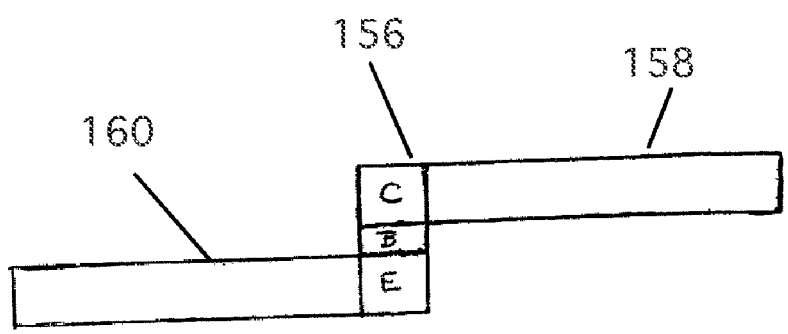
FIG. 5 is a right-side view of the second exemplary embodiment of an ENL, showing the first connector coupled to the collectors of the two transistors and the second connector coupled to the emitters of the two transistors.

FIGS. 3-5 are front perspective, top, and right-side views of a second exemplary embodiment of an ENL, showing the first connector coupled to the collectors of the two transistors and a second connector coupled to the emitters of the two transistors. FIG. 3 is a front perspective view of a second exemplary embodiment of an ENL, showing a first connector 158 coupled to the collectors C of two transistors 154 and 156. FIG. 4 is a top view of the second exemplary embodiment of an ENL, showing the first connector 158 coupled to the collectors C of the two transistors 154 and 156; and a second connector 160 coupled to the emitters E of the two transistors 154 and 156 (see FIG. 5). FIG. 5 is a right-side view of the second exemplary embodiment of an ENL, showing the first connector 158 coupled to the collector C of the transistor 156; and the second connector 160 coupled to the emitter of transistor 156. As shown in FIG. 4, the connectors extend back to the transistor 154, which is not shown in this figure. These figures are discussed below. Before the details of the circuit and transistor construction are given, we will describe fundamental transistor operating characteristics.

Figure 6:
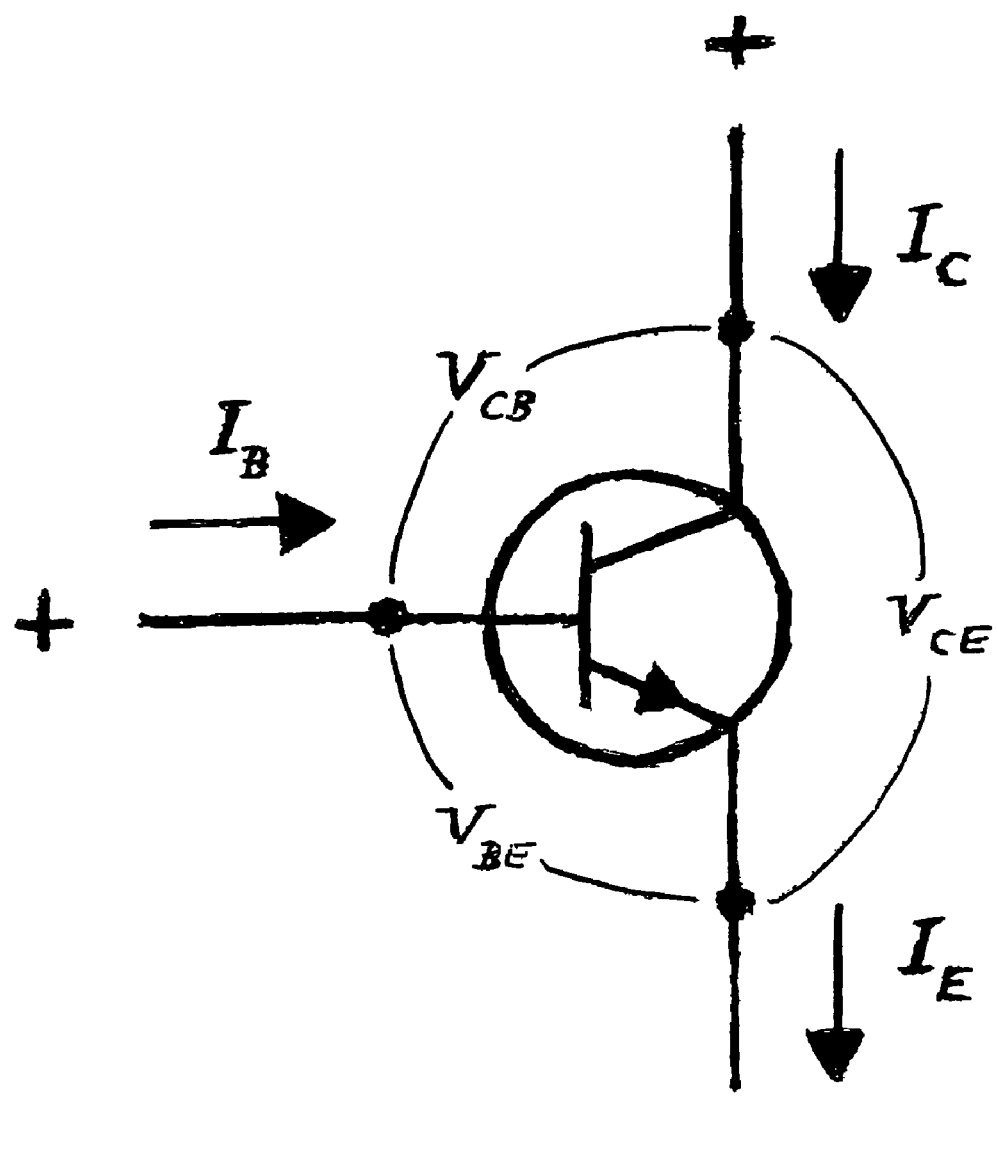
FIG. 6 is a diagram of a typical NPN transistor.
Figure 7:
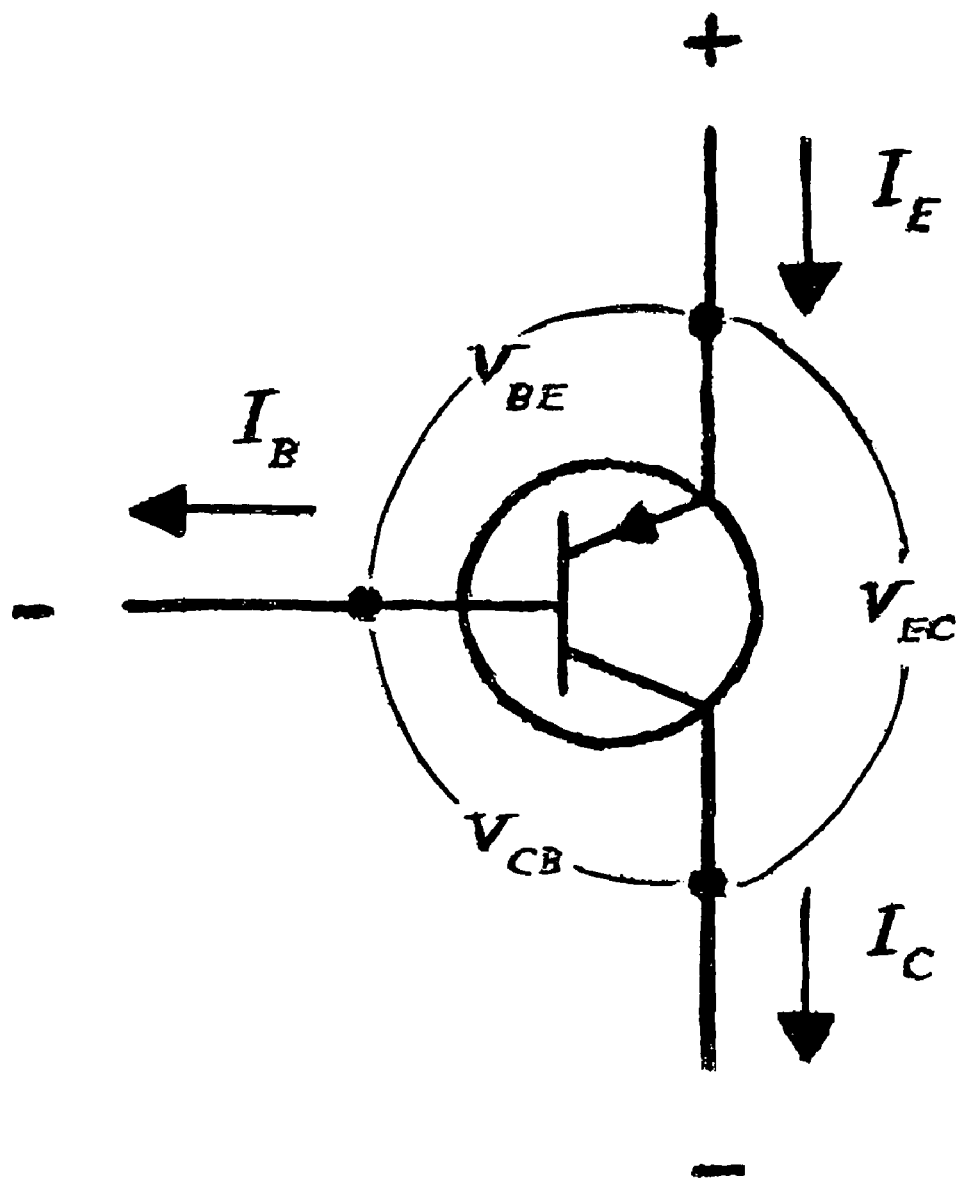
FIG. 7 is a diagram of a typical PNP transistor.
Figure 8:
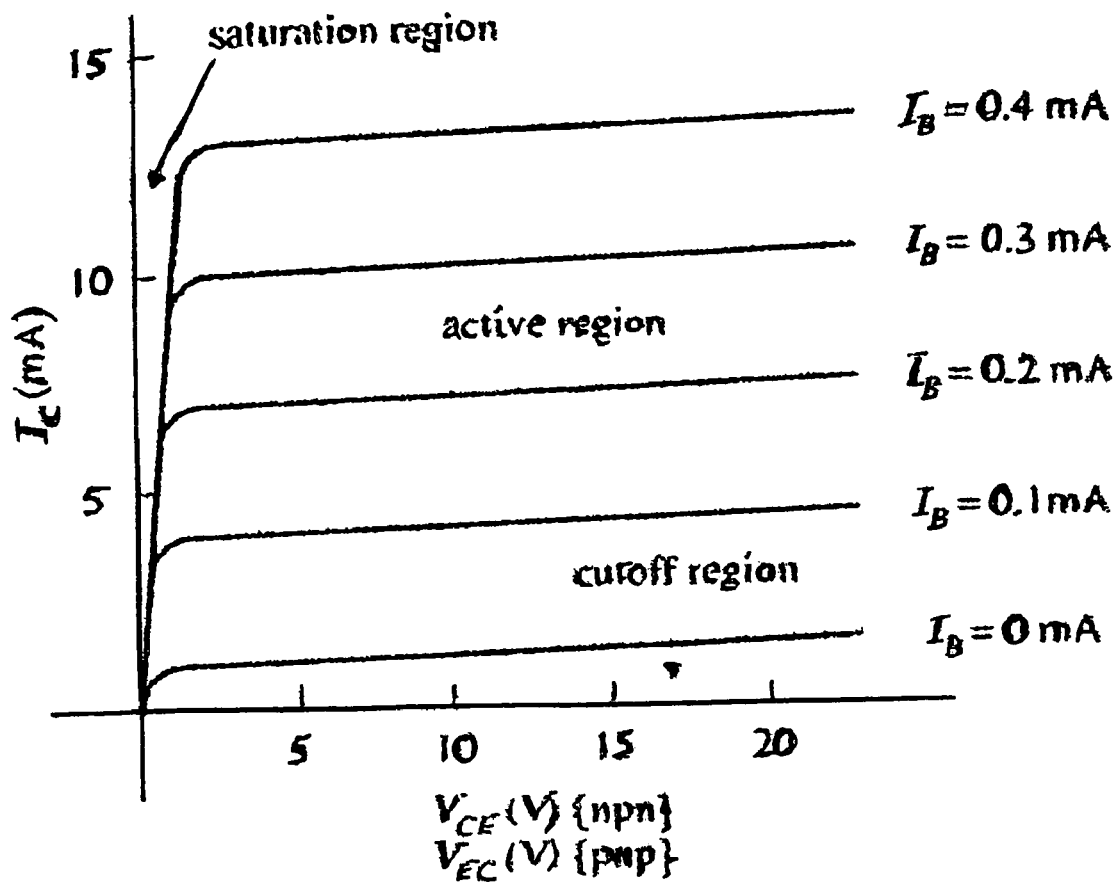
FIG. 8 is a typical family of transistor operating curves.

FIGS. 6-8 show parameter ranges that ENL transistors typically operate in, and are provided to help define notation. FIG. 6 is a diagram of an NPN-type transistor. FIG. 7 is a diagram of a PNP-type transistor. FIG. 8 is a family of curves that shows the operating range of typical transistors in terms of collector current as a function of voltage difference between the collector and emitter ($V_{CE}$, $V_{EC}$) for the two types of transistors. The curves drawn on FIG. 8 are characteristic curves used in the design of the ENL because they are standard and generic.

For the discussion at hand, we will note the direction of current flow into and out of each type of transistor. The NPN transistor receives current from both the base and the collector, then outputs the combined current at the emitter; the PNP transistor, on the other hand, receives current only from the emitter, then outputs what amounts to a split current through the base and the collector. These particular operational features of the two types of transistors are used to devise the closed loop represented by an ENL circuit while at the same time providing an energy balance between the total input and total output of the ENL.

Concerning the notation, terms like $V_{CE}$ represent the difference between the voltage of the collector as opposed to the voltage of the emitter. The same is true of course for terms like $V_{BE}$. Mathematically, $V_{CE} \equiv V_C - V_E$, whereas $V_{BE} \equiv V_B - V_E$, and so forth.

There are certain rules that govern the operation of any bipolar transistor. These rules of operation can be stated as follows.

For an NPN transistor, the voltage at the collector $V_C$ should be greater than the voltage at the emitter $V_E$ ($V_C > V_E$) by at least a few tenths of a volt. On the other hand, for a PNP transistor, the emitter voltage should be greater than the collector voltage ($V_E > V_C$) by a similar amount. (In either case the voltage differences establishes an electric field that serves as the impetus for the direction of current flow).

For an NPN transistor there is a voltage drop from the base to the emitter of about 0.6 volts. For a PNP transistor, in contrast, there is a voltage rise of about 0.6 volts from the base to the emitter.

Transistors can amplify base current. This ability of the transistor is shown in FIG. 8. Various base currents are indicated at the right-most portion of the FIG. 8. For a base current of 0.2 mA when $V_{CE}$ or $V_{EC} \approx 12$ V, for example, the transistor amplifies the base current to about 7.5 mA on the collector. This is an amplification factor of about 37.5. This can be expressed by saying that $I_C = \beta I_B$, where $I_C$ is the collector current, $I_B$ is the base current and where β is the current gain (so, in the foregoing example, β=37.5). The current gain is given in transistor specification tables. The current gain formula applies only if the above two rules are satisfied.

The above characteristics and rules may be mathematically summarized as follows:

$I_C = \beta I_B$ (current gain equation restated)  Equation (1)

$I_E = I_C + I_B$ (conservation of charge)  Equation (2)

Combining these equations gives us an equation that relates emitter and base currents (which is the counterpart of the first gain equation):

$I_E = \beta I_B + I_B = (\beta+1)I_B$  Equation (3)

From the discussion above regarding the about 0.6 V changes:

$V_{BE} = V_B - V_E \approx +0.6\ V (NPN)$  Equation (4)

$V_{BE} = V_B - V_E \approx -0.6\ V (PNP)$  Equation (5)

Finally, the internal, inherently present resistance of a bipolar transistor is called the transresistance, $r_{tr}$, and is suitably expressed as:

$$r_{tr} = f(t) = k + \frac{k}{2\pi^2} \sum_{n=odd}^{\infty} \frac{1}{n^2} \cos n\omega t \qquad \text{Equation (6)}$$

In most circuits, transresistance is negligible. However, because the ENL is going to be designed in a somewhat non-ordinary way for a non-ordinary purpose, the transresistance may not be negligible.

FIG. 2 is a schematic diagram of the first exemplary embodiment of an ENL. In this diagram, arbitrary values for voltages on the transistors (voltage is proportional to energy) have been selected for discussion purposes. These voltages are in accord with the transistor rules discussed above.

As shown, the collector of NPN transistor 112 is charged at +12 V. In other words, $V_{Cnpn}$=12 V. A transistor behaves like an open switch unless there is a base current. That base current can be assured by also setting $V_{Bnpn}$=12 V. As discussed above, in an NPN transistor there will be about a 0.6 V drop (caused by the depletion zone). That means that $V_{Enpn}$=11.4 V. Thus, an electric field (the pathway and impetus for current flow) from the collector, through the base, and on to the emitter exists. The main NPN circuit is completed through element 128, which is used to set $V_{Enpn}$.

Connector 120, coupled to the emitters of NPN transistor 112 and PNP transistor 114, comprises at least some resistance. For this example, the resistance is such that $V_{Enpn}$=11.4 V is dropped to $V_{Epnp}$=11.3 V. In that eventuality, current flow is assured from the emitter of NPN transistor 112 to the emitter of PNP transistor 114. The 0.6 V drop discussed above results in $V_{Bpnp}$=10.7 V. Because connector 118 joins the two bases, and the base of NPN transistor 112 is already set at 12 V, the resistance of connector 118 should be such that the voltage drop across connector 118 is equal to 1.3 V. In turn, to assure an electric field through to the PNP collector, the collector voltage is set to $V_{Cpnp}$=10.6 V. This last PNP circuit is completed through output node 102, although another route can easily be provided if one wished.

We note that although the circuit is drawn so that current flows from the collector of PNP transistor 114 to the collector of NPN transistor 112 (with the current arrow drawn in that direction), the voltages described above would be inappropriate for that purpose. This issue may be addressed by the addition of, for example, a DC power supply ("DCPS"). In the exemplary embodiment of FIG. 2, the DCPS is shown as elements 130 and 132 using the circuit symbol for a battery. Thus, for example, the voltage across element 130 may be 0.6 V and the voltage across element 132 may also be 0.6 V. These two voltage sources are used to increase voltage while not increasing current. Note that either of these voltage sources could be more or less than 0.6 V, depending on the particular circuit design used. Also note that they represent another path length on the ENL circuit. The current path with the additional DCPS path length should remain an integer wavelength.

This addition of the DCPS boosts the voltage, thus assuring current flow as depicted in FIG. 2. The DCPS may be replaced, for example, by a voltage amplification circuit or other means for providing the needed voltage.

In an exemplary embodiment, connectors 116 and 120 comprise semicircular or hemispherical paths. This is done to ensure that that there are only two wavelengths present on the entire ENL orbit.

The rest of the circuit elements are chosen to "tune" the ENL to a desired frequency. This is done using the following analysis. In the exemplary embodiment of FIG. 2, elements 122 and 124 are capacitors such that element 122 comprises high capacitance and element 124 comprises low capacitance. In combination with element 128, the effect is to charge NPN transistor in such a way that no actual current flows. If the capacitance of element 122 is made high enough (for example, in the microfarad range), then the NPN collector is not influenced very much when the superposed signal (such as that from a CCD) passes by. However, if at the same time the capacitance of element 124 is made low enough (for example, in the picofarad or nanofarad range), then element 124 acts like a plain wire for the same signal. Then, during passage of a CCD data window, displacement current flows in NPN transistor 112. NPN transistor 112 "turns on" to displacement current, but only during the passage of the CCD data window. (Note that in this example, the entire ENL circuit is enabled at all times the CCD is turned on).

To explain this desired level of current flow, we note that for elements 122 and 124, the capacitor plate connected to the positive voltage supply becomes positive. The bottom or transistor side of the capacitor draws negative current, electrons, from wherever is available until it is at, in effect, −12 V. That means that on the collector, there exists a situation in which the N-type material the collector is made from is +12 V from its normal electron-rich state. The NPN collector cannot draw electrons from the circuits on the right side of FIG. 2 because there is no current flowing in the base of either NPN transistor 112 or PNP transistor 114. In other words, these circuits are not complete. Likewise, in the quiescent state, the circuits on the left side of FIG. 2 are not complete either, again because there is no current in the PNP base and as a result, the battery or DCPS circuit is open.

However, when a data window passes by, some very rapid changes start to occur. Because of the way the voltage changes in the data window, when the first spike of the data window just does hit element 122, everything gets more positive. That positive change is reflected by a positive change on the NPN collector, but because of the reactance of element 122 the change is relatively small. On the other hand, immediately thereafter, the data window then hits element 124. In element 124, the reactance is low so current flows essentially unimpeded. Additionally, base current now flows. This therefore activates the ENL and the ENL's quantization function.

The final step is picking a quiescent point, in our case a quiescent current, for NPN transistor 112. The question now becomes what values of capacitance to choose for elements 122 and 124 in order to obtain the desired results? It is well known that capacitive reactance is given by the formula:

$$X_C = V_0/I_0 = 1/\omega C \qquad \text{Equation (7)}$$

where $V_0$ and $I_0$ are peak values and where $\omega$ is the angular frequency of the signal. $X_C$ is measured in ohms.

For this example, assume the biasing voltage on the ENL matches the voltage used by a CCD (i.e., about 12 V). If the CCD voltage-spikes are about 12 mV in magnitude and positive then, for this example, $V_O$ would be at most about 12.012 V.

For element 122, we would like the reactance to be high for a given $\omega$ ($\omega=\omega_0$). That reactance, however, should be set based on the frequency components that are present in the input signal. To get at that information, the CCD data window should be represented by a Fourier series expansion. With such an expansion, the dominant frequencies that make up the CCD data window can be determined.

Figure 17:
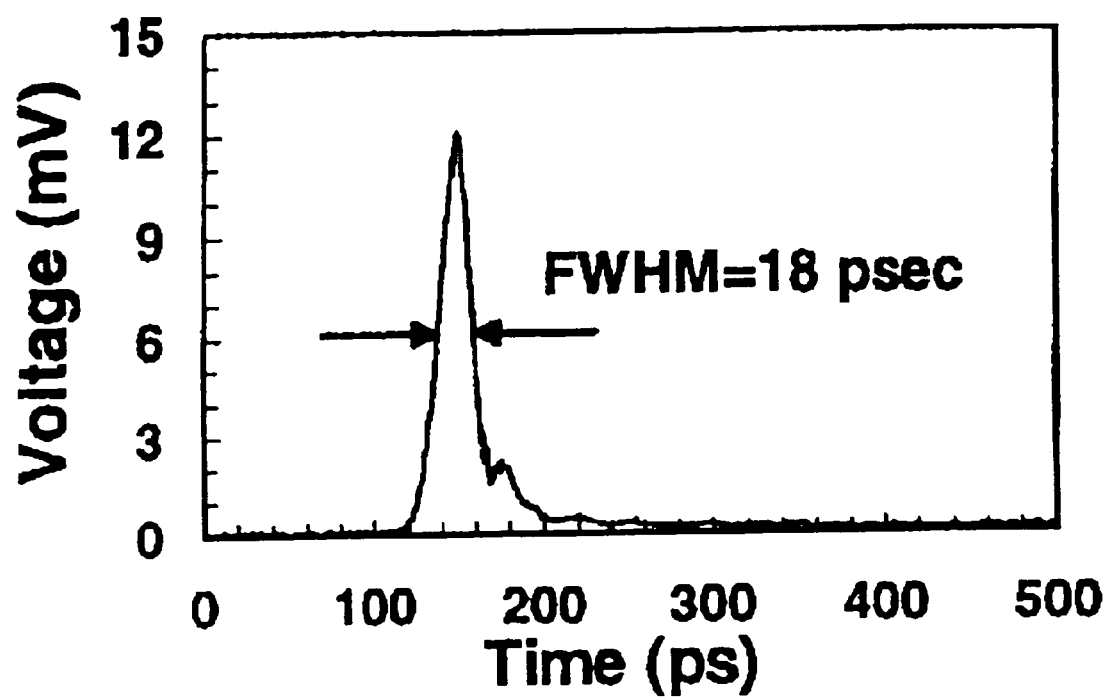
FIG. 17 is a graph of the pulse response of an RCE Schottky photodiode.

The function shown in FIG. 17 is representative of an individual voltage-spike in a digital camera. FIG. 17 looks like a sharply peaked Gaussian probability function. Therefore, for the purposes of this example, the function of FIG. 17 is represented as a Gaussian probability distribution of the form:

$$f(x) = Ne^{-\sigma x^2} \qquad \text{Equation (8)}$$

The Fourier transform of that function is:

$$F(k) = N\sqrt{\frac{1}{2\sigma}}\, e^{-k^2/4\sigma} \qquad \text{Equation (9)}$$

where the above functions have been centered on the origin; where N, often taken as the normalization constant, is here going to be taken as N=12 mV; $\sigma$ is the standard deviation and where $\omega$ is the angular frequency. F(k) is the distribution of "frequencies."

Note that according to FIG. 17, the full-width-at-half-maximum ("FWHM"), is 18 ps (picoseconds or $10^{-12}$ sec). And, because FWHM=2.355 $\sigma$ is a standard normal distribution relationship, 18 ps=2.355 $\sigma$, so that $\sigma=7.64\times10^{-12}$ sec.

To make the form of the above equations match the variables herein, there needs to be a substitution of variables according to the formula that $x=c_i t$, where $c_i$ is as usual the electronic speed in the medium and is taken to be $1.5\times10^8$ m/s (constant). When making this kind of substitution, k also needs to be changed according to the formula $k=\omega/c_i$. Making this substitution gives us:

$$f(t) = Ne^{-\sigma c^2 t^2} \qquad \text{Equation (10)}$$

$$F(\omega) = N\sqrt{\frac{1}{2\sigma}}\, e^{-\omega^2/4\sigma c^4} \qquad \text{Equation (11)}$$

where N and $\sigma$ still refer to the original Gaussian parameters.

The above expressions are centered on the origin. The value of Equation (11) at $\omega=0$ is given by the following expression $$F(0) = N\sqrt{\frac{1}{2\sigma}}$$

where it is found that $F(0)=3.0669\times10^3$. In that case, half-max is $1.5350\times10^3$. Now the question becomes, what frequency characterizes half-max. To answer that question use equation (10), insert the value for half-max, then solve for $\omega$.

$\omega=46.27\times10^{10} Hz.$  Equation (12)

Since $\omega=2\pi f$, $f=7.37\times10^{10} Hz.$  Equation (13)

From Equation (11), one can calculate σ for the transform Gaussian. And, at half-max, most of the nonthermal information in the CCD data window has been incorporated. Additionally, equation (13) demonstrates the size of the ENLs that should be used to build an AFA.

We note that Equation (12) gives a number for ω in the $10^{11}$ order-of-magnitude range. If that number is inserted into Equation (7), it produces:

$X_C=1/\omega C=1/(C\times10^{11})$, and, for C=10 pf, $X_C=1\,\Omega$, whereas for C=1 μf, $X_C=10^5\,\Omega$. Thus, the high frequency informational input associated with the CCD photosites discharging will pass virtually unimpeded through the picofarad capacitor, whereas the same window will encounter a good deal of resistance to passage through the microfarad capacitor. This then confirms the exemplary values of capacitance for elements 122 and 124.

During the quiescent period, $V_{Cnpn}=V_{Bnpn}=12.012\,V\approx12\,V$. In addition, when the data window hits, the NPN collector is only slightly affected but the NPN base current varies directly according to the input signal. From the above rules and equations governing the behavior of transistors, Equation (4) can be applied to ascertain that $V_{Enpn}\approx11.4\,V$. If it is assumed that the connector between the emitters of NPN transistor 112 and PNP transistor 114 is of minimal resistance, then $V_{Epnp}=11.4\,V$. From Equation (5) we find that $V_{Bpnp}=10.8\,V$.

Now if, in the circuit shown, the base of NPN transistor 112 is $\approx12\,V$ and the base of the PNP transistor 114 is $\approx10.8\,V$, then connector 118 should have some significant resistance to reduce the voltage. The issue here is that to make the base connector have that resistance, a resistor should be inserted into the circuit or connector 118 should be doped in such a way that it comprises that resistance.

The above description and examples show the basic principles involved in ENL design. Of course, the circuit can be modified to handle any particular type of input wave and frequency components by performing the same type of calculation above with the parameters changed to meet the new operating characteristics.

In an exemplary embodiment, connectors 116, 118, and 120 comprise integrated-circuit copper wiring. And, in the exemplary embodiment, the ENLs may look like circles when viewed from above (see, e.g., FIG. 4). In particular, connector 118 joining the bases of NPN transistor 112 and PNP transistor 114 may be constructed in a semicircular fashion. Such a construction keeps the bases of NPN transistor 112 and PNP transistor 114 appropriately in phase with each other, assuring proper operation and quantization of the circuit. Keeping in mind the quantization feature, an exemplary frequency range for operation of an AFA—with two transistors in an ENL circuit with one wavelength per leg—should have $\lambda=\pi r$.

The frequency implied by this wavelength depends upon the medium within which the wavelength is present, according to the standard formula, $c_i=\lambda f$, where $c_i$ is the ith medium velocity and where f is the linear frequency.

FIGS. 9 and 10 are tables comparing, for given ENL orbit radii, implied wavelength and frequency for two indicated media (using the shown electronic speeds in those media).

Note that the first three entries in the first column of FIG. 9 are somewhat unrealistic in that the values chosen for the ENL orbit radii are the same as those that exemplify feature size in FIGS. 11-16. Despite this, even where the ENL orbit radius is as large as about 3 micrometers (second-to-last entry in the second column), the implied frequency, being in the terahertz range, is much too high for currently available computers to handle. However, μm ENLs can handle terahertz frequencies (if these are the signals, for example, output by a CCD), so AFAs comprising μm ENLs may serve as a substrate manifold.

In that case, the CCD output then would be in a form representative of a Fourier series representation of what the CCD "sees." In that eventuality, outgoing data may be serialized and slowed down to computer speed from the original CCD/AFA speed. As for the framing of data, that can be accomplished electronically or by a movie-camera-type shutter system.

Many computer chips are currently constructed with a 130-nanometer feature size. Feature size is, for example, the width of wires etched on a chip or the width of transistors on the chip. Many chip manufacturers are now moving toward smaller feature sizes, in one case to a feature size of 65 nm. To illustrate the range of feature sizes for ENLs and AFAs, FIGS. 11 and 14 assume a feature size of 10 nm; FIGS. 12 and 15 assume a feature size of 50 nm; and FIGS. 13 and 16 assume a feature size of 100 nm.

An alternative construct is to insert an AFA between a computer-speed-output CCD and a computer. This should require the ENLs of the AFA to be able to quantize signals at a much lower frequency than those indicated in FIG. 9.

FIG. 10 shows ENL orbit radii increased to macro-dimensions. From FIG. 10, one may note that ENLs can quantize frequencies that can be handled by currently available computers only when the ENL orbit radius reaches the centimeter-size range. This is an extremely large orbit radius ENL to have to produce in order to fit current computer-clock speed. But, it should be understood that ENL orbit radius is also affected by the resistance of the connecting wires. That is, high-resistance wire means that the actual physical radius of the wires can be correspondingly smaller. While one may build ENLs appropriately sized for microchip manufacture by using conducting media with different resistance, the speed of these ENLs will be slowed down accordingly. One should appreciate that this slowdown in ENL speed is relatively small in comparison to the times involved in the Fourier calculations associated with current analysis methods.

FIGS. 9 and 10 were developed using the quantization equation:

$2\pi r=mn\lambda; m,n\in\{\text{integers}\} | m\geq2, n\geq2, r=r_{in}, r_{out}$  Equation (14)

In effect, the values given for the ENL radii are for the one-dimensional, ideal case. However, the connectors (such as, for example, electronic or neural wires) involved in the making of an AFA comprise a certain width or widths. What will be quantized on a given ENL is not a particular frequency, but a band of frequencies. This band, whether in terms of wavelength or frequency, may be calculated using a formula that gives the linear wavelength in terms of radius. Such a formula can be derived from the consideration that $\lambda=(0.5$ (ENL radius). This should assure that one wavelength "fits" on one leg of the ENL orbit. This mathematical notion may be expressed as $\lambda=\pi r$. More generally, $\lambda=z\pi r$, where z is the number of wavelengths on one leg of the ENL, considering an ENL made up of only two transistors.

If the geometry of FIGS. 3-5 is maintained, for an electromagnetic wave to be quantized on the offset toroidal ENL, at least one entire wavelength should be on each leg. If we concern ourselves only with two-transistor ENLs then, in Equation (14), m=2 and n=1, in which case $\pi r=\lambda$ and, in differential form, $\pi dr=d\lambda$.

For the case at hand, one may use $\pi r=\lambda$ and FIG. 3 to calculate the allowable electromagnetic bandwidth. That is, $$\pi(b-a)=(\lambda_b-\lambda_a) \qquad \text{Equation (15)}$$

where, from FIG. 3, (b−a) is recognized as the feature size. Note that the dimension given as "h" in FIG. 3 does not appear in these calculations. This is because of, first, the skin effect, i.e., currents reside of the surface of a conductor and, second, because the thickness of the conducting wire "h" can be very much less than even the feature size.

Equation (15) can now be rewritten as:

$$(\lambda_b-\lambda_a)=\pi(\text{feature size}). \qquad \text{Equation (16)}$$

Using once again the notation that $c_i$=electronic speed in the ith medium, and that $c_i=\lambda f$, Equation (16) may be used to solve for $f_b$ (outside frequency) when $f_a$ (inside frequency) is given, as in FIGS. 9 and 14-16.

$$f_b=c_i f_a/[c_i+\pi f_a(\text{feature size})] \qquad \text{Equation (17)}$$

Equations (15) and (16) are derived based on the geometry within which a component, or more accurately components, of an electromagnetic signal are diverted. If an ENL were not closed then, within the bounds of certain cable transmission restrictions, the ENL could carry the entire bandwidth of the incoming signal. However, the ENL is closed which means that certain wavelengths are quantized on the loop. Shorter or longer wavelengths than those to which the ENL has been tuned destructively interfere with each other, meaning that the ENL allows energy to be extracted from the incoming signal only within the confines of a certain bandwidth. These bandwidths may be calculated using Equations (15), (16), and/or (17).

To complete this discussion of bandwidth, the radii given in FIGS. 9 and 10 can be considered the inside radii, the distance "a" in FIG. 3. In that case, Equation (15) can be written as:

$$\lambda_b=\lambda_a+\pi(\text{feature size}) \qquad \text{Equation (18)}$$

Another table may now be constructed showing various wavelengths $\lambda_a$ from FIGS. 9 and 10, along with the adopted feature sizes to demonstrate what effect feature size has on bandwidth. In Equation (18), all measurements can be expressed in terms of nanometers. The results are shown in FIGS. 11-13. All entries shown in FIGS. 11-13 are therefore expressed in nanometers as well.

Note that the third, fourth, and fifth rows represent µm ENLs, as discussed above.

FIGS. 11-13 are rather simple in that the outside radius and, hence, outside wavelength of the ENL wire vary only according to a fixed additive term. This term is proportional to the feature size, so smaller feature size means less bandwidth, which in turn means more accurate quantization.

FIGS. 14-16 demonstrate this same principle for frequency. In FIGS. 14-16, the quantity $f_a$ is taken from FIGS. 9 and 10. The quantities labeled as $f_b$ are then calculated using Equation (17). The last column of FIGS. 14-16 gives the bandwidth in terms of frequency. In these tables, the third, fourth, and fifth row entries also correspond to the µm ENLs discussed above. From these last columns, we note that as feature size goes down, frequency bandwidth and, thus, uncertainty go down as well.

The exact wiring diagram for the AFA for which FIG. 1 is a representational view is dependent on protocols that depend on the specific purpose or purposes for the AFA and also on the input and output parameters. These may be considered and adopted when a manufacturer uses the AFA either as a part of some existing circuitry or as a stand-alone device.

To demonstrate how an AFA produces a Fourier series expansion automatically, an example follows. In this example, it is not intended to suggest that the AFA must return representatively characteristic outputs. Instead, it is suggested that the AFA can return representatively characteristic outputs. For the purposes of this example, a saw tooth wave as shown in FIG. 18 will be used.

Figure 18:
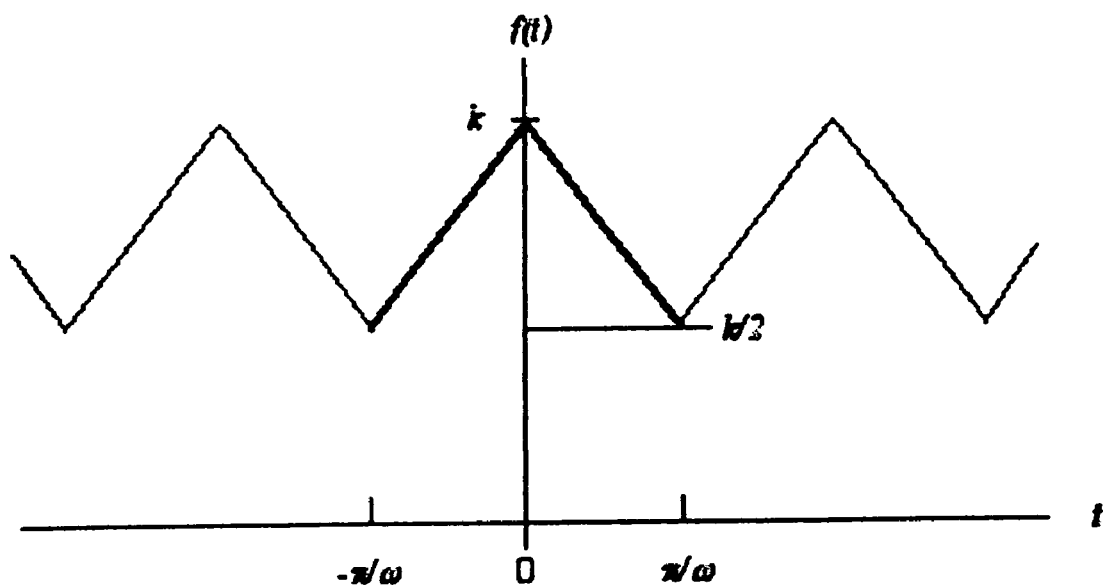
FIG. 18 is a graph of a saw tooth waveform showing the Fourier Transform components superimposed.

As discussed above, ENLs can be used in an AFA that can assign codes to the graphical representation of the saw tooth function of FIG. 18. Then the code sets produced by the AFA and by hand will match. It should be stressed, however, that the theoretical calculation of the codes will be mathematically ideal whereas an AFA using a camera input will produce codes that are "fuzzy" owing to the fact that the ENL wires have a finite width and will, as a result, quantize a band of frequencies, albeit a very narrow band.

A full Fourier Series Representation ("FSR") of the function depicted in FIG. 9 with symmetrical limits, with period T (where $T=2\pi/\omega$) and with variable t is given by (Butkov, E., *Mathematical Physics*, Addison Wesley, Reading, Mass., 1968, page 160), as $$\begin{cases} f(t) = \dfrac{a_0}{2} + \sum_{n=1}^{\infty}(a_n\cos n\omega t + b_n\sin n\omega t) & \text{(a)} \\ a_n = \dfrac{\omega}{\pi}\int_{-\pi/\omega}^{+\pi/\omega} f(t)\cos n\omega t\, dt & \text{(b)} \\ a_0 = \dfrac{\omega}{\pi}\int_{-\pi/\omega}^{+\pi/\omega} f(t)\, dt & \text{(c)} \end{cases}$$

$$b_n = \dfrac{\omega}{\pi}\int_{-\pi/\omega}^{+\pi/\omega} f(t)\sin n\omega t\, dt \qquad \text{(d)}$$

The function defined by the dark lines in FIG. 18 can be expressed also in point-intercept form. In general the function is:

$$f(t)=mt+d$$

where m is the slope and d is the y-intercept. According to FIG. 18, the y-intercept is k in both cases. The slope of the line to the left of the origin is $(k\omega/2\pi)$, whereas on the right, the slope is $(-k\omega/2\pi)$.

Thus, to calculate $a_0$, then $$a_0 = \frac{\omega}{\pi}\int_{-\pi/\omega}^{+\pi/\omega} f(t)\,dt$$

$$a_0 = \frac{\omega}{\pi}\left[\int_{-\pi/\omega}^{0}(k\omega t/2^1 + k)dt + \int_{0}^{t/\omega}(-k\omega t/2^1 + k)dt\right]$$

$$a_0 = \frac{\omega}{\pi}\left[(k\omega/2^1)\int_{-\pi/\omega}^{0}t\,dt + k\int_{-\pi/\omega}^{0}dt - k\omega/2^1\int_{0}^{t/\omega}t\,dt + \int_{0}^{t/\omega}dt\right]$$

$$a_0 = 2k,$$

whereas for $a_n$, $$a_n = \frac{\omega}{\pi}\left[(k\omega/2^1)\int_{-\pi/\omega}^{0} t\cos(n\omega t)dt + k\int_{-\pi/\omega}^{0}\cos(n\omega t)dt\right] +$$
$$\frac{\omega}{\pi}\left[(-k\omega/2^1)\int_{0}^{\pi/\omega} t\cos(n\omega t)dt + k\int_{0}^{\pi/\omega}\cos(n\omega t)dt\right]$$

The second and fourth integrals, above, integrate to sines. When either limit is inserted, these terms are zero. The first and third integrals, read $$a_n = \frac{k}{2}\left(\frac{\omega}{\pi}\right)^2\left[\int_{-\pi/\omega}^{0} t\cos(n\omega t)dt - \int_{0}^{\pi/\omega} t\cos(n\omega t)dt\right]$$

To integrate let $u=n\omega t \Rightarrow dt=du/(n\omega)$. Also, when $t=0$, $u=0$, and when $t=\pm(\pi/\omega)$, $u=\pm\pi n$.

$$a_n = \frac{k}{2}\left(\frac{\omega}{\pi}\right)^2\left\{\left[\frac{1}{n^2\omega^2}\cos u - \frac{u}{n\omega}\sin u\right]_{-n'}^{0} - \left[\frac{1}{n^2\omega^2}\cos u - \frac{u}{n\omega}\sin u\right]_{0}^{n'}\right\}$$

The terms involving sin(u) are zero at the limits. This produces:

$$a_n = \frac{k}{2}\left(\frac{1}{\pi}\right)^2\left\{\left[\frac{1}{n^2}\cos u\right]_{-n'}^{0} - \left[\frac{1}{n^2}\cos u\right]_{0}^{n'}\right\}$$

When evaluated at the limits the above expression shows that $a_n=0$ for n=even; $a_n=2k/\pi^2 n^2$ for n=odd.

In a like fashion, $b_0=0$, whereas $$b_n = \frac{\omega}{\pi}\int_{-\pi/\omega}^{+\pi/\omega} f(t)\sin n\omega t\,dt$$

becomes $$b_n = \frac{\omega}{\pi}\left[(k\omega/2^1)\int_{-\pi/\omega}^{0} t\sin(n\omega t)dt + k\int_{-\pi/\omega}^{0}\sin(n\omega t)dt\right] +$$
$$\frac{\omega}{\pi}\left[(-k\omega/2s)\int_{0}^{\pi/\omega} t\sin(n\omega t)dt + k\int_{0}^{\pi/\omega}\sin(n\omega t)dt\right]$$

Again, let $u=n\omega t \Rightarrow dt=du/(n\omega)$. Also, when $t=0$, $u=0$, and when $t=\pm(\pi/\omega)$, $u=\pm\pi n$. The integrals involving just the sin(u) terms integrate to zero. So, once again, the first and third integrals read $$b_n = \frac{k}{2}\left(\frac{\omega}{\pi}\right)^2\left\{\left[\frac{1}{n^2\omega^2}\sin u - \frac{u}{n\omega}\cos u\right]_{-n'}^{0} - \left[\frac{1}{n^2\omega^2}\sin u - \frac{u}{n\omega}\cos u\right]_{0}^{n'}\right\}$$

Inserting the limits, the u cos(u) terms are zero at the zero limit, whereas the terms involving sin(u) are zero at the same limit. That leaves:

$$b_n = \frac{k}{2}\left(\frac{\omega}{\pi}\right)^2\left\{\left[\frac{\sin u}{n^2\omega^2} - \frac{u\cos u}{n\omega}\right]_{-n'} - \left[\frac{\sin u}{n^2\omega^2} - \frac{u\cos u}{n\omega}\right]^{n'}\right\}$$

Note that with the $\pm n\pi$ limit, sin(u) is always zero. The u cos(u) terms, on the other hand, subtract out. So, $b_n=0$.

Finally, we can write the expression for the full FSR for the symmetrical triangle depicted in FIG. 18 as:

$$f(t) = k + \frac{2k}{\pi^2}\sum_{n=odd}^{\infty}\frac{1}{n^2}\cos n\omega t \qquad \text{Equation (19)}$$

From this expression, one may calculate which frequencies the ENLs should be tuned to in order for the AFA camera to reproduce the Fourier components as a unique code to accompany the picture.

When these are set and tuned, the AFA produces a set of analog output signals equal to a quantity at frequency $-\pi/\omega$, a quantity at the zero frequency point, and a quantity at frequency $\pi/\omega$.

Other embodiments of the present invention will be apparent to those skilled in the art from consideration of this specification and practice of the present invention disclosed in the specification. It is intended that the specification and examples in the specification be considered as exemplary only, with the true scope and spirit of the present invention being indicated by the following claims.

What is claimed is:

1. An apparatus for detecting one or more spectral components in a predetermined frequency band within a signal, the apparatus comprising:
    a first processing device, comprising:
    a first element;
    a second element; and
    a third element;
    wherein said first element, second element and third element are electrically interconnected and forming an active, analog circuit component;
    a second processing device, comprising:
    a fourth element;
    a fifth element; and
    a sixth element;
    wherein said fourth element, fifth element and sixth element are electrically interconnected and forming an active, analog circuit component;
    a first connector directly and linearly connecting said first element to said fourth element;
    a second connector directly and linearly connecting said second element to said fifth element; and a third connector directly and linearly connecting said third element to said sixth element;
    wherein said first, second or third connectors do not cross in any connecting path;
    wherein each connector is tuned to the predetermined frequency band.

2. The apparatus of claim 1, wherein at least one of the processing devices comprises an electrochemical device.

3. The apparatus of claim 1, wherein at least one of the processing devices comprises a semiconductor device.

4. The apparatus of claim 3, wherein the semiconductor device comprises a transistor.

5. The apparatus of claim 3, wherein the semiconductor device comprises a field effect transistor.

6. The apparatus of claim 3, wherein the semiconductor device comprises a complementary metal-oxide semiconductor.

7. The apparatus of claim 3, wherein the semiconductor device comprises a bipolar junction transistor.

8. The apparatus of claim 3, wherein the semiconductor device comprises an NPN transistor.

9. The apparatus of claim 3, wherein the semiconductor device comprises a PNP transistor.

10. The apparatus of claim 3, wherein the first element is a base of a transistor, wherein the second element is a collector of the transistor, and wherein the third element is an emitter of the transistor.

11. The apparatus of claim 1, wherein at least one of the connectors comprises an ohmic connection.

12. The apparatus of claim 1, wherein at least one of the connectors comprises a waveguide.

13. The apparatus of claim 1, wherein at least one of the connectors comprises an integrated circuit conducting connection.

14. The apparatus of claim 1, wherein at least one of the connectors comprises an integrated circuit semiconducting connection.

15. The apparatus of claim 1, wherein the first processing device comprises an NPN transistor, and wherein the second processing device comprises a PNP transistor.

16. An apparatus for detecting one or more spectral components in a predetermined frequency band within an input signal, the apparatus comprising:
    an input for receiving the input signal;
    a first semiconductor device coupled to the input, comprising:
    a first element;
    a second element; and
    a third element;
    wherein said first element, second element and third element are electrically interconnected and forming an active, circuit component;
    a second semiconductor device coupled to the input, comprising:
    a fourth element;
    a sixth element;
    wherein said fourth element, fifth element and sixth element are electrically interconnected and forming an active, circuit component;
    a first connector directly and linearly connecting said first element to said fourth element;
    a second connector directly and linearly connecting said second element to said fifth element; and a third connector directly and linearly connecting said third element to said sixth element;
    wherein said first, second or third connectors do not cross in any connecting path;
    wherein each connector is tuned to the predetermined frequency band;
    an output coupled to the first and second semiconductor devices;
    said apparatus having an output; and
    wherein the output provides an output signal comprising an amplitude proportional to an amplitude of the one or more spectral components.

17. The apparatus of claim 16, wherein the output provides an output signal comprising a voltage proportional to a voltage of the one or more spectral components.

18. The apparatus of claim 16, wherein the output provides an output signal comprising a current proportional to a current of the one or more spectral components.

19. A method for detecting one or more spectral components in a predetermined frequency band within an input signal, the method comprising:
    receiving the input signal;
    inputting the input signal to first and second processing devices; and outputting an output signal from the first and second processing devices;
    wherein the first processing device comprises:
    a first element;
    a second element; and
    a third element;
    wherein said first element, second element and third element are electrically interconnected and forming an active, circuit component;
    wherein the second processing device comprises:
    a fourth element;
    a fifth element; and
    a sixth element;
    wherein said fourth element, fifth element and sixth element are electrically interconnected and forming an active, circuit component;
    wherein a first connector directly and linearly couples the first and fourth elements, wherein a second connector directly and linearly couples the second and fifth elements, wherein a third connector directly and linearly couples the third and sixth elements, such that said first, second or third connectors do not cross in any connecting path, wherein each connector is tuned to the frequency band, and wherein the output signal comprises one or more amplitudes each proportional to an amplitude of the one or more spectral components.

20. The method of claim 19, wherein at least one of the processing devices comprises an electrochemical device.

21. The method of claim 19, wherein at least one of the processing devices comprises a semiconductor device.

22. The method of claim 21, wherein the semiconductor device comprises a transistor.

23. The method of claim 21, wherein the semiconductor device comprises a field effect transistor.

24. The method of claim 21, wherein the semiconductor device comprises a complementary metal-oxide semiconductor.

25. The method of claim 21, wherein the semiconductor device comprises a bipolar junction transistor.

26. The method of claim 21, wherein the semiconductor device comprises an NPN transistor.

27. The method of claim 21, wherein the semiconductor device comprises a PNP transistor.

28. The method of claim 21, wherein the first element is a base of a transistor, wherein the second element is a collector of the transistor, and wherein the third element is an emitter of the transistor.

29. The method of claim 19, wherein at least one of the connectors comprises an ohmic connection.

30. The method of claim 19, wherein at least one of the connectors comprises a waveguide.

31. The method of claim 19, wherein at least one of the connectors comprises an integrated circuit conducting connection.

32. The method of claim 19, wherein at least one of the connectors comprises an integrated circuit semiconducting connection.

33. The method of claim 19, wherein the first processing device comprises an NPN transistor, and wherein the second processing device comprises a PNP transistor.

34. The method of claim 19 wherein a computer program code for executing said method is stored in a computer-readable medium.

35. The method of claim 34 wherein the stored output is in analog form.

36. The method of claim 34 wherein the stored output is in digital form.

37. The method of claim 34 wherein the stored output comprises at least one digitized data word.

38. A frequency filter, comprising:
a first processing device, comprising:
a first element;
a second element; and
a third element;
wherein said first element, second element and third element are electrically interconnected and forming an active, circuit component;
a second processing device, comprising:
a fourth element;
a fifth element; and
a sixth element;
wherein said fourth element, fifth element and sixth element are electrically interconnected and forming an active, circuit component;
a first connector directly connecting said first element to said fourth element;
a second connector directly connecting said second element to said fifth element; and a third connector directly connecting said third element to said sixth element;
and further wherein the first processing device comprises a first electrochemical device, and wherein the second processing device comprises a second electrochemical device.

* * * * *